United States Patent
Ma et al.

(10) Patent No.: US 12,207,568 B2
(45) Date of Patent: Jan. 21, 2025

(54) FABRICATION METHOD FOR SUPERCONDUCTING CIRCUIT AND SUPERCONDUCTING QUANTUM CHIP

(71) Applicant: Origin Quantum Computing Technology (Hefei) Co., Ltd, Hefei (CN)

(72) Inventors: Liangliang Ma, Hefei (CN); Bing You, Hefei (CN); Nianci Wang, Hefei (CN); Jie Zheng, Hefei (CN); Wenshu Liu, Hefei (CN)

(73) Assignee: Origin Quantum Computing Technology (Hefei) Co., Ltd, Hefei (CN)

( * ) Notice: Subject to any disclaimer, the term of this patent is extended or adjusted under 35 U.S.C. 154(b) by 13 days.

(21) Appl. No.: 18/315,401

(22) Filed: May 10, 2023

(65) Prior Publication Data

US 2024/0357945 A1    Oct. 24, 2024

Related U.S. Application Data

(63) Continuation of application No. PCT/CN2022/076517, filed on Feb. 16, 2022.

(30) Foreign Application Priority Data

Feb. 26, 2021   (CN) .......................... 202110215894.6

(51) Int. Cl.
*H10N 60/01* (2023.01)
*H10N 60/12* (2023.01)

(52) U.S. Cl.
CPC ......... *H10N 60/0912* (2023.02); *H10N 60/12* (2023.02)

(58) Field of Classification Search
CPC ........................... H10N 60/0912; H10N 60/12
See application file for complete search history.

(56) References Cited

U.S. PATENT DOCUMENTS 3,816,845 A * 6/1974 Cuomo ................ H10N 60/128
257/38
6,419,779 B1   7/2002 DePetrillo et al.
(Continued)

FOREIGN PATENT DOCUMENTS

CN         1189934 A    8/1998
CN       103608942 A    2/2014
(Continued)

OTHER PUBLICATIONS

First Office Action issued in counterpart Chinese Patent Application No. 202110215894.6, dated Jan. 27, 2022.
(Continued)

*Primary Examiner* — Shih Tsun A Chou
(74) *Attorney, Agent, or Firm* — Westbridge IP LLC

(57) ABSTRACT

Disclosed are a fabrication method for a superconducting circuit and a superconducting quantum chip. The fabrication method includes: determining, on a substrate, a first junction region located between a first electrical element and a second electrical element, and a second junction region located between a first conductive plate and a second conductive plate that are formed in advance; forming a Josephson junction in the second junction region; detect an electrical parameter of the Josephson junction, and determining whether the electrical parameter is within a target parameter range; if yes, separating the Josephson junction through cutting, and moving the Josephson junction to the first junction region; and forming a first connection structure connecting the first superconducting layer to the first electrical element and a second connection structure connecting (Continued)

the second superconducting layer to the second electrical element.

16 Claims, 7 Drawing Sheets

(56) References Cited

U.S. PATENT DOCUMENTS

| | | | |
|---|---|---|---|
| 2003/0148591 A1* | 8/2003 | Guo | ................ H01L 21/2007 438/455 |
| 2014/0076497 A1 | 3/2014 | Honda et al. | |
| 2014/0246763 A1 | 9/2014 | Bunyk | |
| 2016/0204071 A1 | 7/2016 | Liu et al. | |

FOREIGN PATENT DOCUMENTS

| | | | |
|---|---|---|---|
| CN | 106816525 A | 6/2017 | |
| CN | 111505478 A | 8/2020 | |
| CN | 111554798 A | 8/2020 | |
| CN | 113036030 A | 6/2021 | |
| JP | 2000315697 A | 11/2000 | |
| KR | 20040073073 A | 8/2004 | |

OTHER PUBLICATIONS

International Search Report issued in corresponding PCT Application No. PCT/CN2022/076517, dated Apr. 29, 2022.
Notification to Grant Patent Right for Invention issued in counterpart Chinese Patent Application No. 202110215894.6, dated Feb. 18, 2022.
Written Opinion issued in corresponding PCT Application No. PCT/CN2022/076517, dated Apr. 29, 2022.

* cited by examiner

FABRICATION METHOD FOR SUPERCONDUCTING CIRCUIT AND SUPERCONDUCTING QUANTUM CHIP

CROSS-REFERENCE TO RELATED APPLICATIONS

This application is a continuation of International Application No. PCT/CN2022/076517, filed on Feb. 16, 2022, which claims priority to Chinese Patent Application No. 202110215894.6, filed with the China National Intellectual Property Administration on Feb. 26, 2021 and entitled "FABRICATION METHOD FOR SUPERCONDUCTING CIRCUIT AND SUPERCONDUCTING QUANTUM CHIP". The disclosures of the aforementioned applications are hereby incorporated by reference in their entireties.

TECHNICAL FIELD

The present application belongs to the field of quantum computing technologies, and in particular, the present application relates to a fabrication method for a superconducting circuit and a superconducting quantum chip.

BACKGROUND

Quantum computing is a very important field that has been widely concerned at home and abroad. As is known, a superconducting qubit system based on a Josephson junction has advantages such as good scalability and high fidelity gate-operation, and thus is considered to be one of the most promising systems for implementing quantum computing. As a key element of a superconducting quantum chip, the Josephson junction is a structure formed by three layers of thin films, namely, superconductor (S)-semiconductor or insulator (I)-superconductor (S). Generally, the Josephson junction includes two layers of superconducting metal, such as niobium film or aluminum film, and a barrier layer is sandwiched between the two layers of superconducting metal. The barrier layer is generally a very thin oxide film. In a quantum chip of a superconducting qubit system, a superconducting circuit including a Josephson junction is formed, where one superconductor of the Josephson junction is connected to a ground capacitor, and the other superconductor is connected to the ground or a ground electrical element.

At present, due to fluctuations in a fabrication process of a Josephson junction and inability to accurately determine an electrical parameter of a Josephson junction connected to a superconducting circuit in advance, it is generally impossible to ensure that the fabricated superconducting circuit including a Josephson junction meets design requirements, ultimately resulting in a problem that a quantum chip containing the superconducting circuit has always had a low yield rate.

SUMMARY

The present application provides a fabrication method for a superconducting circuit and a superconducting quantum chip, thereby solving a deficiency in the related art, and at least solving a problem that it is currently difficult to fabricate a related superconducting circuit with a performance parameter meeting requirements.

The present application provides a fabrication method for a superconducting circuit, where the superconducting circuit may include a Josephson junction, and the Josephson junction may include a first superconducting layer electrically connected to a first electrical element and a second superconducting layer electrically connected to a second electrical element. The fabrication method may include the following steps:

determining, on a substrate, a first junction region located between the first electrical element and the second electrical element, and a second junction region located between a first conductive plate and a second conductive plate that are formed in advance;

forming the Josephson junction in the second junction region, and enabling the first superconducting layer and the second superconducting layer of the Josephson junction to be electrically connected to the first conductive plate and the second conductive plate in a one-to-one correspondence manner;

connecting the first conductive plate and the second conductive plate to a detection circuit to detect an electrical parameter of the Josephson junction, and determining whether the electrical parameter is within a target parameter range;

if the electrical parameter is within the target parameter range, separating the Josephson junction from the first conductive plate and the second conductive plate through cutting, and moving the Josephson junction to the first junction region; and forming a first connection structure connecting the first superconducting layer to the first electrical element and a second connection structure connecting the second superconducting layer to the second electrical element.

In an implementation of the present application, the first electrical element, the second electrical element, the first conductive plate, and the second conductive plate may be formed in advance by using a patterning process.

In an implementation of the present application, the second junction region may include a first deposition region and a second deposition region, and a partial overlap exists between the first deposition region and the second deposition region.

In an implementation of the present application, a barrier layer may be formed between the first superconducting layer and the second superconducting layer.

In an implementation of the present application, the barrier layer may be an oxide film layer.

In an implementation of the present application, the first electrical element may be a capacitor, and the second electrical element may be a ground layer.

In another implementation of the present application, the step of separating the Josephson junction from the first conductive plate and the second conductive plate through cutting, and moving the Josephson junction to the first junction region may include:

cutting and removing a graft structure including a second portion substrate and the Josephson junction, where the second portion substrate is a portion of the substrate where the Josephson junction is located; and forming a first junction groove in the first junction region, and moving the graft structure into the first junction groove.

In an implementation of the present application, microscopic cutting may be performed by using a focused ion beam to implement cutting and removing of the graft structure, and after the graft structure is cut and removed from the second junction region, a corresponding second junction groove may be synchronously formed in the second junction region.

In an implementation of the present application, the step of forming the Josephson junction in the second junction region, and enabling the first superconducting layer and the second superconducting layer of the Josephson junction to be electrically connected to the first conductive plate and the second conductive plate in a one-to-one correspondence manner may include:

forming a superconducting material layer partially located in the second junction region and enabling one end of the superconducting material layer to extend to be electrically connected to the first conductive plate;

oxidizing the superconducting material layer to form the first superconducting layer and the oxide film layer on the first superconducting layer; and forming the second superconducting layer having one end extending to be electrically connected to the second conductive plate, and enabling the second superconducting layer to be partially located on the oxide film layer, where the Josephson junction is formed at a stacked position of the first superconducting layer, the oxide film layer, and the second superconducting layer.

In an implementation of the present application, the step of forming the Josephson junction in the second junction region, and enabling the first superconducting layer and the second superconducting layer of the Josephson junction to be electrically connected to the first conductive plate and the second conductive plate in a one-to-one correspondence manner may include:

sequentially forming the first superconducting layer, the oxide film layer, and the second superconducting layer, where the first superconducting layer, the oxide film layer, and the second superconducting layer are partially overlapped at the second junction region to form the Josephson junction; and forming a first transition structure covering part of the first superconducting layer and part of the first conductive plate, and forming a second transition structure covering part of the second superconducting layer and part of the second conductive plate.

In an implementation of the present application, an extending direction of the first transition structure may be different from an extending direction of the first superconducting layer; and/or an extending direction of the second transition structure may be different from an extending direction of the second superconducting layer.

In an implementation of the present application, the extending directions of the first transition structure and the second transition structure may be parallel to each other.

In an implementation of the present application, before the step of forming a first transition structure covering part of the first superconducting layer and part of the first conductive plate, and forming a second transition structure covering part of the second superconducting layer and part of the second conductive plate, the fabrication method may further include:

a step of removing an oxide layer on a surface of the first conductive plate and an oxide layer on a surface of the second conductive plate.

In an implementation of the present application, the step of removing an oxide layer on a surface of the first conductive plate and an oxide layer on a surface of the second conductive plate may include:

removing the oxide layer on the surface of the first conductive plate and the oxide layer on the surface of the second conductive plate by using an ion beam etching.

In an implementation of the present application, before the step of forming a first connection structure connecting the first superconducting layer to the first electrical element, and a second connection structure connecting the second superconducting layer to the second electrical element, the fabrication method may further include:

a step of removing an oxide layer on a surface of the first electrical element and an oxide layer on a surface of the second electrical element.

The present application may further provide a superconducting quantum chip, and the superconducting quantum chip includes a superconducting circuit fabricated by using the fabrication method for a superconducting circuit according to the present application.

Compare to the related art, in the present application, first, on a substrate, a first junction region located between the first electrical element and the second electrical element, and a second junction region located between a first conductive plate and a second conductive plate that are formed in advance are determined; then, the Josephson junction is formed in the second junction region, and the first superconducting layer and the second superconducting layer of the Josephson junction are enabled to be electrically connected to the first conductive plate and the second conductive plate in a one-to-one correspondence manner; next, the first conductive plate and the second conductive plate are connected to a detection circuit to detect an electrical parameter of the Josephson junction, and whether the electrical parameter is within a target parameter range is determined; if the electrical parameter is within the target parameter range, the Josephson junction is cut and separated from the first conductive plate and the second conductive plate, and moved to the first junction region; and finally, a first connection structure connecting the first superconducting layer to the first electrical element is formed and a second connection structure connecting the second superconducting layer to the second electrical element is formed. In this way, the Josephson junction with the first superconducting layer electrically connected to the first electrical element and the second superconducting layer electrically connected to the second electrical element is fabricated, and the electrical parameter of the fabricated Josephson junction is within the target parameter range, thus ensuring that the fabricated superconducting circuit meets design requirements, and further contributing to improving a yield rate of a quantum chip including the superconducting circuit.

DETAILED DESCRIPTION OF THE EMBODIMENTS

Figure 1:
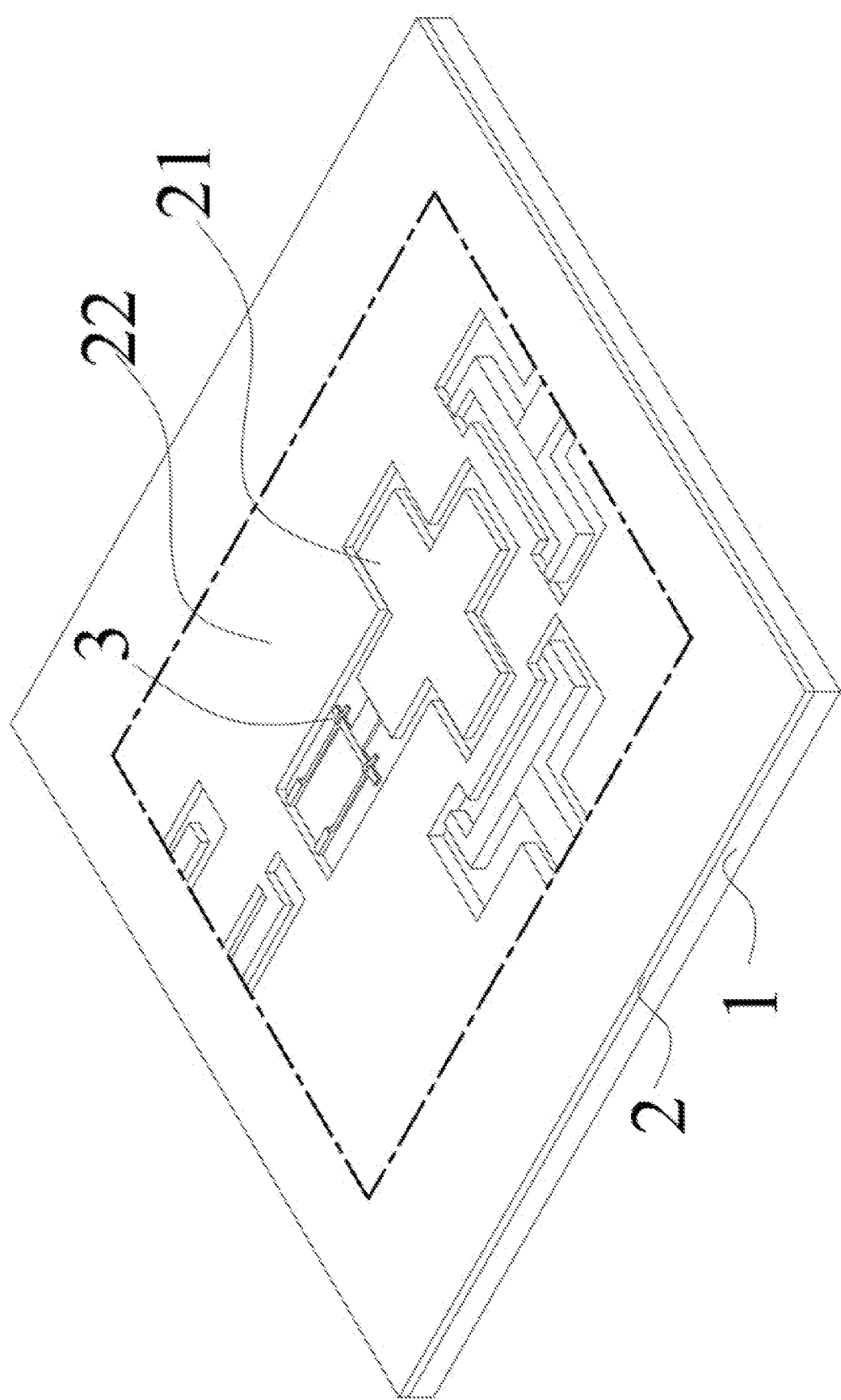
FIG. 1 is a schematic structural diagram of a quantum chip of a superconducting system in the related art.

To make the objectives, technical solutions, and advantages of the embodiments of the present application clearer, the following describes the embodiments of the present application in detail with reference to the accompanying drawings. However, a person of ordinary skill in the art may understand that many technical details are put forward in the embodiments of the present application to make a reader better understand the present application. However, it should be noted that, in a case of not departing from the spirit of the present application, even without the technical details and various changes and modifications on a basis of the following embodiments, the technical solutions claimed in the present application may be implemented. The division of the following embodiments is for convenience of description, and should not constitute any limitation on the specific implementations of the present application, and various embodiments may be mutually referenced on the premise of no contradiction.

It should be noted that the terms "first", "second" and the like in this specification, claims, and drawings of the present application are used to distinguish between similar objects, rather than to describe a particular order or a sequential order. It should be understood that these terms used are interchangeable under appropriate circumstances such that the embodiments illustrated or described herein are capable of being implemented in an order different from that illustrated or described herein. Furthermore, the terms "include" and "have", as well as any variations thereof (for example, "including" and "having") are intended to cover a non-exclusive inclusion, and represent "including but not limited to". For example, a process, method, system, product, or device that includes a series of steps or units is not necessarily limited to those expressly listed steps or units, but may include other steps or units not expressly listed or inherent to such process, method, product, or device.

In addition, it should be understood that when a layer (or film), region, pattern or structure is referred to as being "on" a substrate, layer (or film), region, and/or pattern, it may be directly on another layer or substrate, and/or there may be an insertion layer. In addition, it should be understood that when a layer is referred to as being "under" another layer, it may be directly under another layer, and/or there may be one or more insertion layers. In addition, for "on" a layer and "under" a layer, reference may be made to the figures.

The solutions of the present application are made at least with regard to the following problem: due to fluctuations in fabrication and evaporation processes of a mask pattern involved in a fabrication process of a superconducting circuit and inability to accurately determine an electrical parameter of a Josephson junction connected to the superconducting circuit in advance, it is impossible to ensure that a superconducting circuit including a Josephson junction meets design requirements, ultimately resulting in a problem that a superconducting quantum chip fabricated by using the foregoing processes has always had a low yield rate.

For example, the present application relates to a superconducting circuit, which is a qubit in a superconducting system quantum chip. The purpose of the present application will be described in detail below in combination with a structure and fabrication process of the qubit.

FIG. 1 is a schematic structural diagram of a quantum chip of a superconducting system in the related art. Referring to FIG. 1, in the quantum chip of the superconducting system, one form of configuration of a qubit includes a ground capacitor and a closed-loop apparatus connected in parallel with the ground capacitor, and the closed-loop apparatus is constituted by Josephson junctions 3 connected in parallel. For example, the closed-loop apparatus may be constituted by two Josephson junctions 3 connected in parallel. The Josephson junction 3 in a qubit is a structure with a relatively small size, the size thereof is generally one or two hundred nanometers, and a tiny size change may affect a performance parameter of the Josephson junction 3, thereby affecting a performance parameter of the qubit.

A fabrication process of a superconducting qubit in the related art may include the following steps: first, forming a superconducting metal layer 2 on a substrate 1, patterning the superconducting metal layer 2 to obtain a pattern structure such as a ground layer (GND) and a ground capacitor, and exposing, between the ground layer (GND) and the ground capacitor, a fabrication region for fabricating a Josephson junction 3; and then performing a related process for fabricating the Josephson junction 3 on the substrate 1 in the fabrication region, for example, applying a photoresist on the substrate 1, performing exposure and development to form a mask pattern layer with a window, and then performing evaporation, oxidation and re-evaporation in the fabrication region by using the mask pattern layer, to obtain the Josephson junction 3 electrically connected to the ground capacitor and the ground layer (GND).

However, as understood by a person skilled in the art, it is generally impossible to ensure that the fabricated Josephson junction 3 meets design requirements due to inability to precisely control the process of forming a mask pattern layer and the processes of evaporation, oxidation and re-evaporation. In addition, after the fabrication is completed, an electrical parameter of the Josephson junction 3 cannot be obtained accurately by detection due to interference of other elements in a superconducting circuit. Therefore, using of the fabrication process in the related art cannot ensure that the superconducting circuit including the Josephson junction 3 meets design requirements, finally resulting in a problem that a superconducting quantum chip fabricated by the foregoing processes always has a low yield rate.

Hereinafter, a fabrication method for a superconducting circuit and a fabricated superconducting circuit according to embodiments of the present application will be described in detail with reference to the accompanying drawings.

Figure 2:
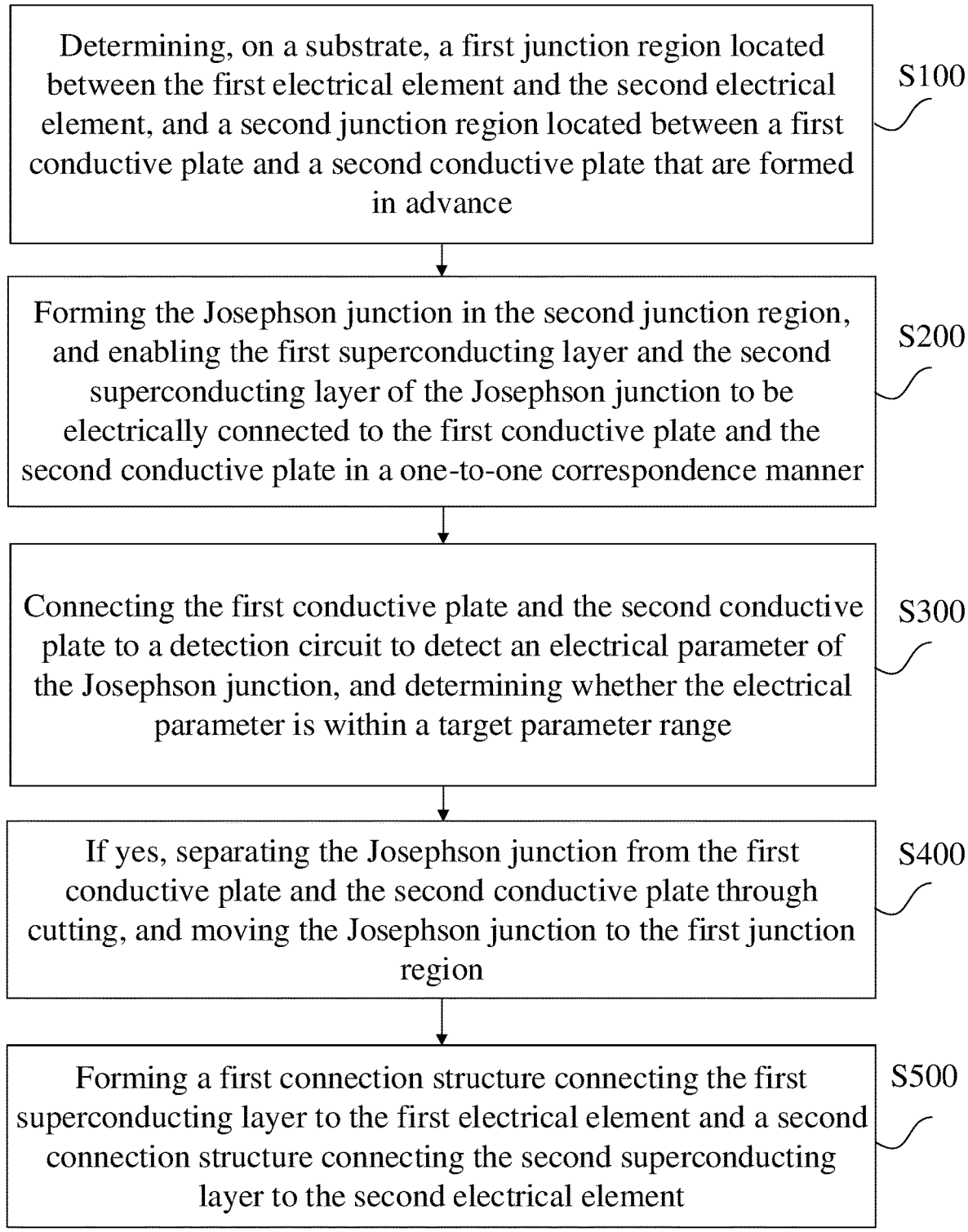
FIG. 2 is a flowchart of a fabrication method for a superconducting circuit according to an embodiment of the present application.

FIG. 2 is a flowchart of a fabrication method for a superconducting circuit according to an embodiment of the present application; FIG. 3A to FIG. 3E are schematic structural diagrams corresponding to the process steps in FIG. 2; and FIG. 4 is an enlarged schematic diagram of a graft structure 6 in FIG. 3A to FIG. 3E.

With reference to FIG. 2, FIG. 3A to FIG. 3E, and FIG. 4, an embodiment of the present application provides a fabrication method for a superconducting circuit, where the superconducting circuit includes a Josephson junction 3, and the Josephson junction 3 includes a first superconducting layer 31 electrically connected to a first electrical element 21 and a second superconducting layer 33 electrically connected to a second electrical element 22. The fabrication method may include Step S100 to Step S500.

Figure 3A:
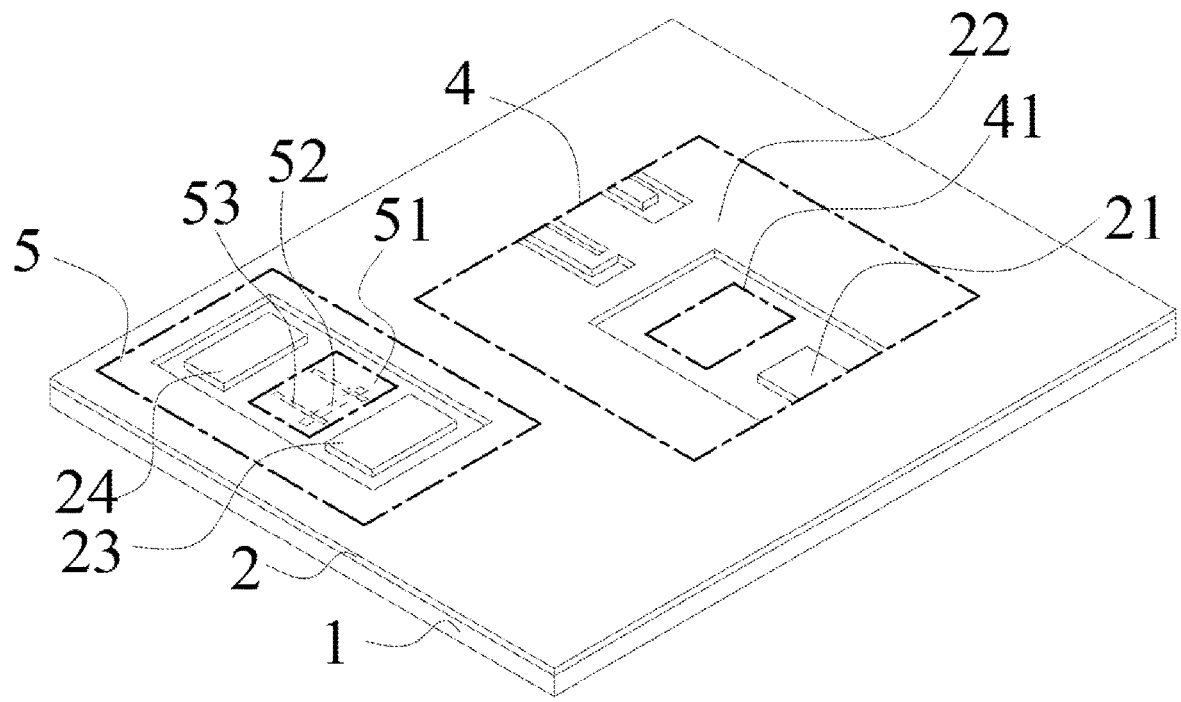
FIG. 3A is a schematic structural diagram corresponding to Step S100 in FIG. 2.
Figure 4:
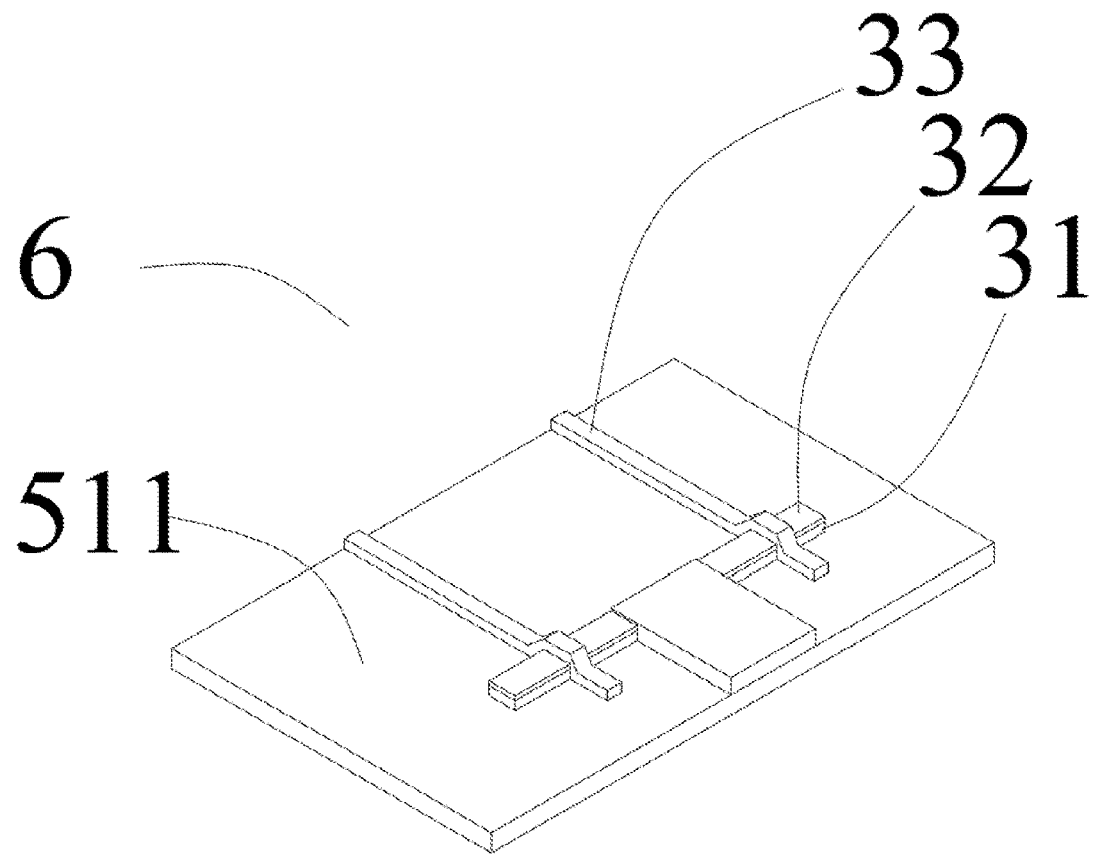
FIG. 4 is an enlarged schematic diagram of a graft structure 6 in FIG. 3A to FIG. 3E.

In Step S100, with reference to FIG. 3A, on a substrate 1, a first junction region 41 located between the first electrical element 21 and the second electrical element 22, and a second junction region 51 located between a first conductive plate 23 and a second conductive plate 24 that are formed in advance are determined.

In this step, the first electrical element 21, the second electrical element 22, the first conductive plate 23, and the second conductive plate 24 may all be formed in advance by using a patterning process. For example, after a superconducting metal layer 2 is formed on the substrate 1, the superconducting metal layer 2 is patterned to obtain the first electrical element 21, the second electrical element 22, the first conductive plate 23 and the second conductive plate 24. The first electrical element 21 and the second electrical element 22 are located in a core region 4 on the substrate 1, and the first conductive plate 23 and the second conductive plate 24 are located in a test region 5 on the substrate 1. The core region 4 is used for fabricating the superconducting circuit of the present application, and the test region 5 is used for fabricating the superconducting Josephson junction 3 in advance and detecting an electrical parameter of the superconducting Josephson junction 3. The core region 4 includes a first junction region 41 located between the first electrical element 21 and the second electrical element 22. The test region 5 includes a second junction region 51 located between the first conductive plate 23 and the second conductive plate 24, and areas of the first conductive plate 23 and the second conductive plate 24 may be adjusted as required by using a patterning process. The second junction region 51 includes a first deposition region 52 and a second deposition region 53, and a partial overlap exists between the first deposition region 52 and the second deposition region 53.

It should be noted that, the drawings of the embodiments of the present application only schematically show components or structures located in the core region 4. It should be noted that some of the components or structures located in the core region 4 are not shown or only partially illustrated.

Figure 3B:
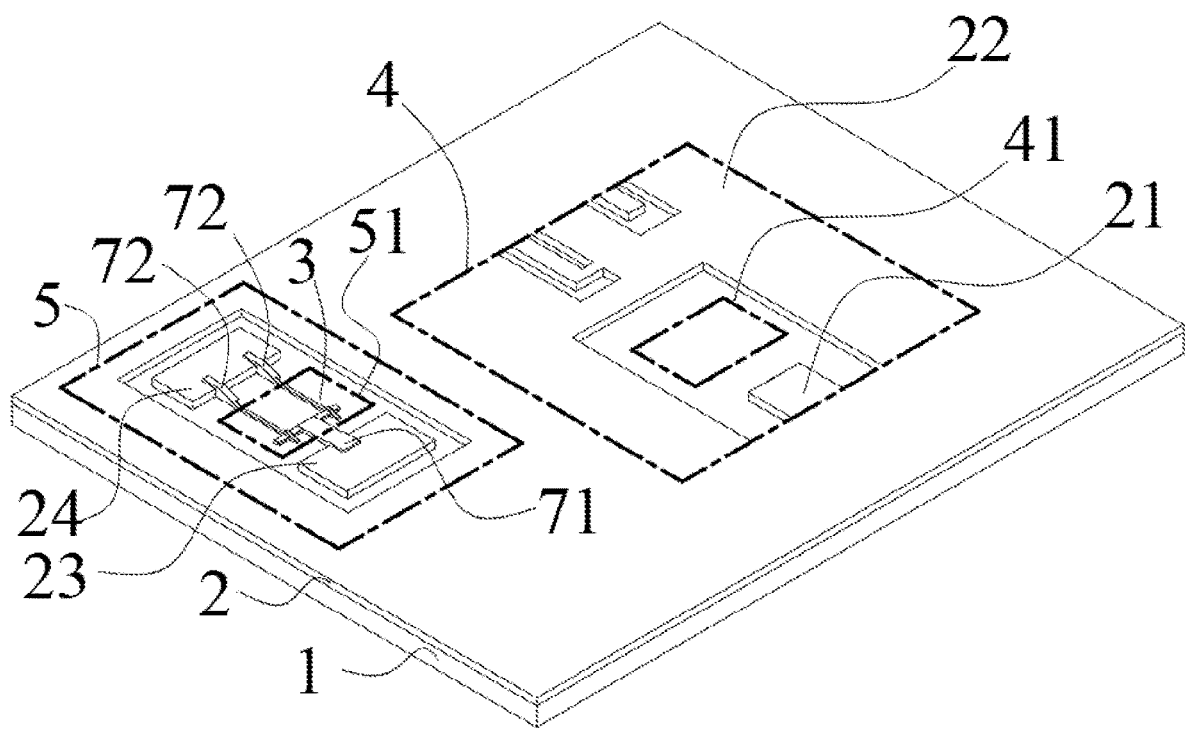
FIG. 3B is a schematic structural diagram corresponding to Step S200 in FIG. 2.

In Step S200, with reference to FIG. 3B, the Josephson junction 3 is formed in the second junction region 51, and the first superconducting layer 31 and the second superconducting layer 33 of the Josephson junction 3 are enabled to be electrically connected to the first conductive plate 23 and the second conductive plate 24 in a one-to-one correspondence manner. Specifically, the first superconducting layer 31 of the Josephson junction 3 is electrically connected to the first conductive plate 23, and the second superconducting layer 33 of the Josephson junction 3 is electrically connected to the second conductive plate 24.

Those skilled in the art may understand that the Josephson junction 3 may further include a barrier layer located between the first superconducting layer 31 and the second superconducting layer 33, and the barrier layer may be a very thin oxide film layer 32, as shown in FIG. 4.

Figure 3C:
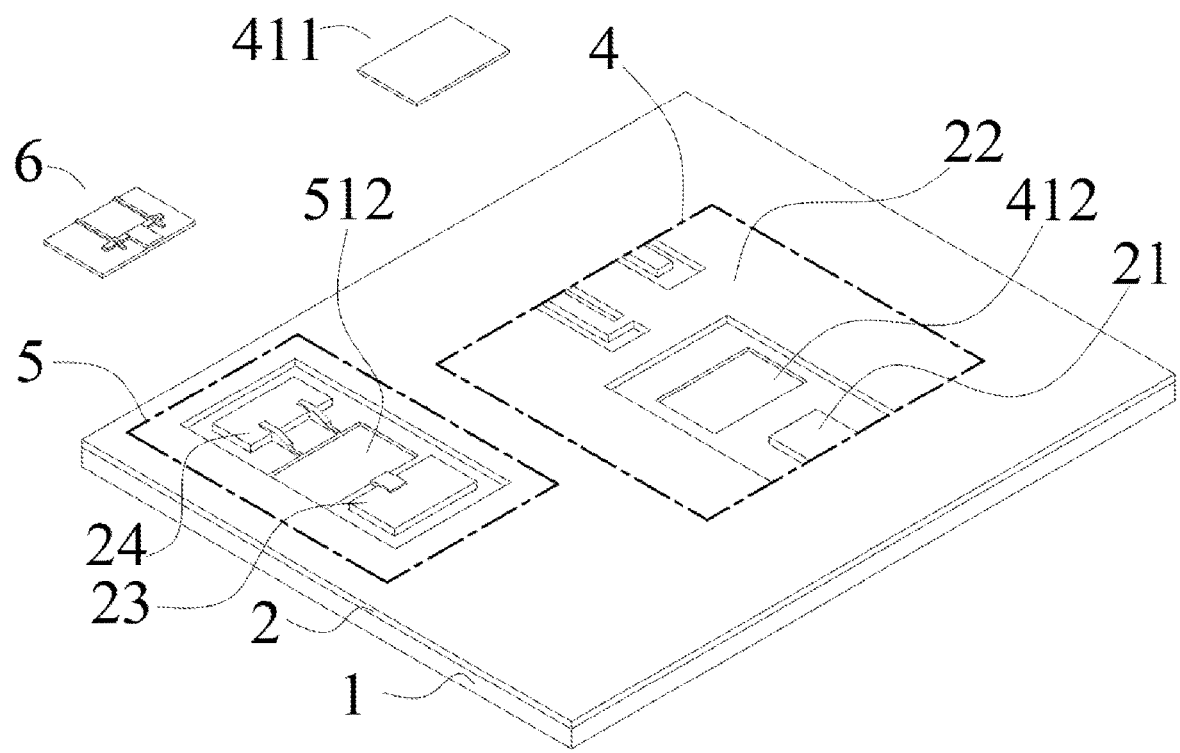
FIG. 3C is a schematic structural diagram corresponding to Step S300 in FIG. 2.

In Step S300, with reference to FIG. 3C, the first conductive plate 23 and the second conductive plate 24 are connected to a detection circuit to detect an electrical parameter of the Josephson junction 3, and determine whether the electrical parameter is within a target parameter range. For example, the first conductive plate 23 and the second conductive plate 24 are connected through direct contact of a probe to a detection circuit including a lock-in amplifier, so as to test an electrical parameter of the obtained Josephson junction 3 by using the lock-in amplifier. For example, an resistance value of the obtained Josephson junction 3 is tested by using the lock-in amplifier.

Figure 3D:
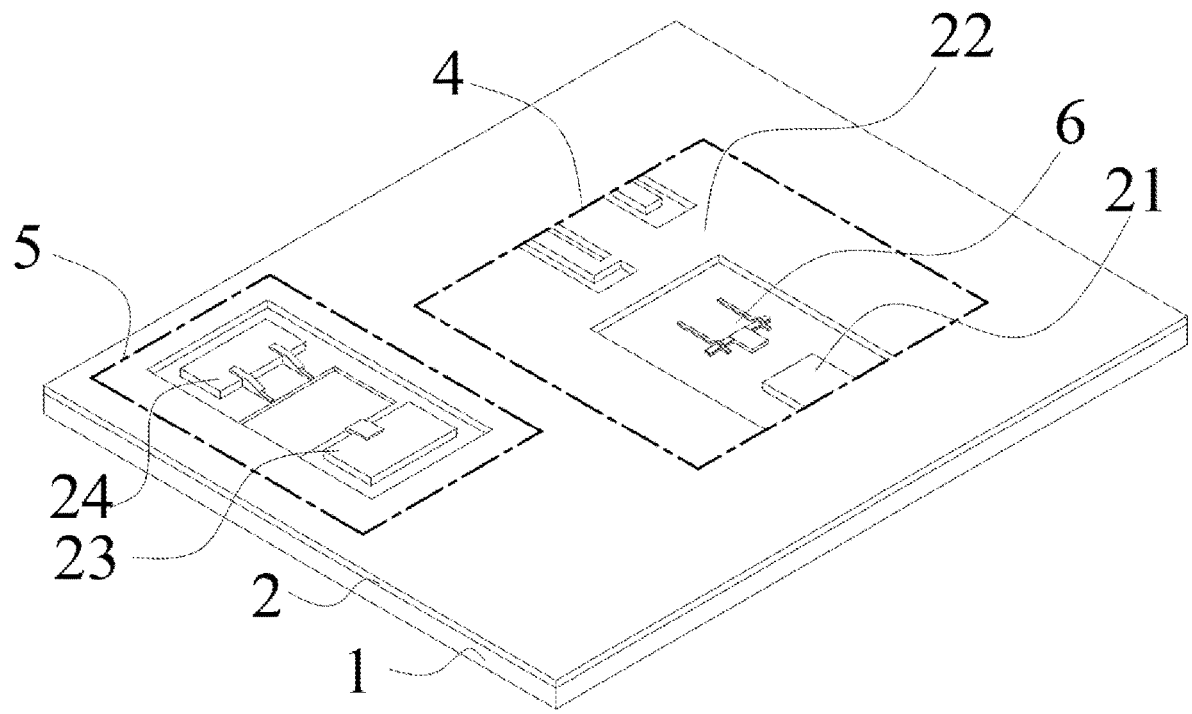
FIG. 3D is a schematic structural diagram corresponding to Step S400 in FIG. 2.

In Step S400, with reference to FIG. 3D, if the electrical parameter is within the target parameter range, the Josephson junction 3 is cut and separated from the first conductive plate 23 and the second conductive plate 24, and then moved to the first junction region 41. In this step, separating the Josephson junction 3 from the first conductive plate 23 and the second conductive plate 24 through cutting may be implemented by using a nano-processing technology.

Figure 3E:
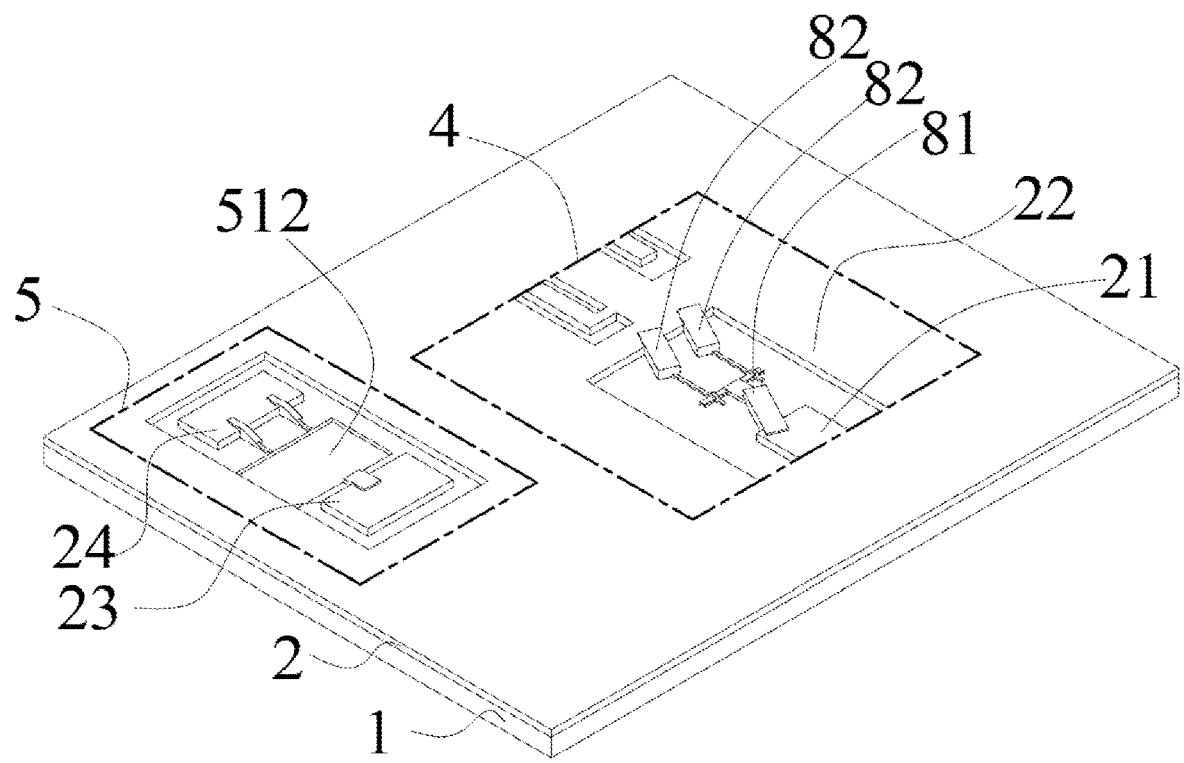
FIG. 3E is a schematic structural diagram corresponding to Step S500 in FIG. 2.

In Step S500, with reference to FIG. 3E, a first connection structure 81 for connecting the first superconducting layer 31 to the first electrical element 21 and a second connection structure 82 for connecting the second superconducting layer 33 to the second electrical element 22 are formed. For example, after the Josephson junction 3 is moved to the first junction region 41, the substrate 1 is moved into a coating chamber, a pre-fabricated silicon-on-insulator (SOI) hard mask pattern is aligned with the substrate 1, and coating is performed by using the SOI hard mask pattern to form the first connection structure 81 and the second connection structure 82.

Compared with the related art, in the embodiment of the present application, the following Josephson junction 3 is fabricated through Step S100 to Step S500. In the Josephson junction 3, the first superconducting layer 31 is electrically connected to the first electrical element 21 and the second superconducting layer 33 is electrically connected to the second electrical element 22, and an electrical parameter of the Josephson junction 3 is within a target parameter range. Therefore, the Josephson junction fabricated in the embodiment of the present application solves the problem that it is difficult to fabricate a related superconducting circuit with a performance parameter meeting requirements in the related art, and the fabricated superconducting circuit in the embodiment of the present application can meet design requirements, thereby contributing to improving a yield rate of a quantum chip including the superconducting circuit.

In some embodiments of the present application, the first electrical element 21 is a ground capacitor, and the second electrical element 22 is a ground layer (GND), so as to form a qubit constituted by the ground capacitor and a Josephson junction closed-loop apparatus connected in parallel with the ground capacitor. During specific implementation, the first electrical element 21 and the second electrical element 22 are not limited thereto, and the first electrical element 21 and the second electrical element 22 may be any electrical elements that need to be connected to the Josephson junction 3 to implement a function of a superconducting circuit.

The Josephson junction is a structure formed by three layers of thin films, that is, a stacked structure of superconductor (S)-semiconductor or insulator (I)-superconductor (S). In some embodiments of the present application, the Josephson junction 3 in step 200 may be formed by using an overlap technique, a shadow evaporation technique. In Step S200, a pattern transfer process during fabrication of an integrated circuit may be combined to form the first superconducting layer 31, the barrier layer 32, and the second superconducting layer 33. For example, the step of forming the Josephson junction 3 in the second junction region 51, and enabling the first superconducting layer 31 and the second superconducting layer 33 of the Josephson junction 3 to be electrically connected to the first conductive plate 23 and the second conductive plate 24 in a one-to-one correspondence manner in Step S200 may include: first, forming a superconducting material layer partially located in the second junction region 51 and enabling one end of the superconducting material layer to extend to be electrically connected to the first conductive plate 23; then oxidizing the superconducting material layer to form the first superconducting layer 31 and the oxide film layer 32 on the first superconducting layer 31; and finally, forming the second superconducting layer 33 having one end extending to be electrically connected to the second conductive plate 24, and enabling the second superconducting layer 33 to be partially located on the oxide film layer 32, where a stacked structure of superconductor (S)-semiconductor or insulator (I)-superconductor (S) is at a stacked position of the first superconducting layer 31, the oxide film layer 32, and the second superconducting layer 33.

It should be understood that, in the solutions of the present application, the specific implementation of Step S200 is not limited thereto, and some implementations of the embodiments of the present application will be further described below with reference to FIG. 3A to FIG. 6B.

Figure 5:
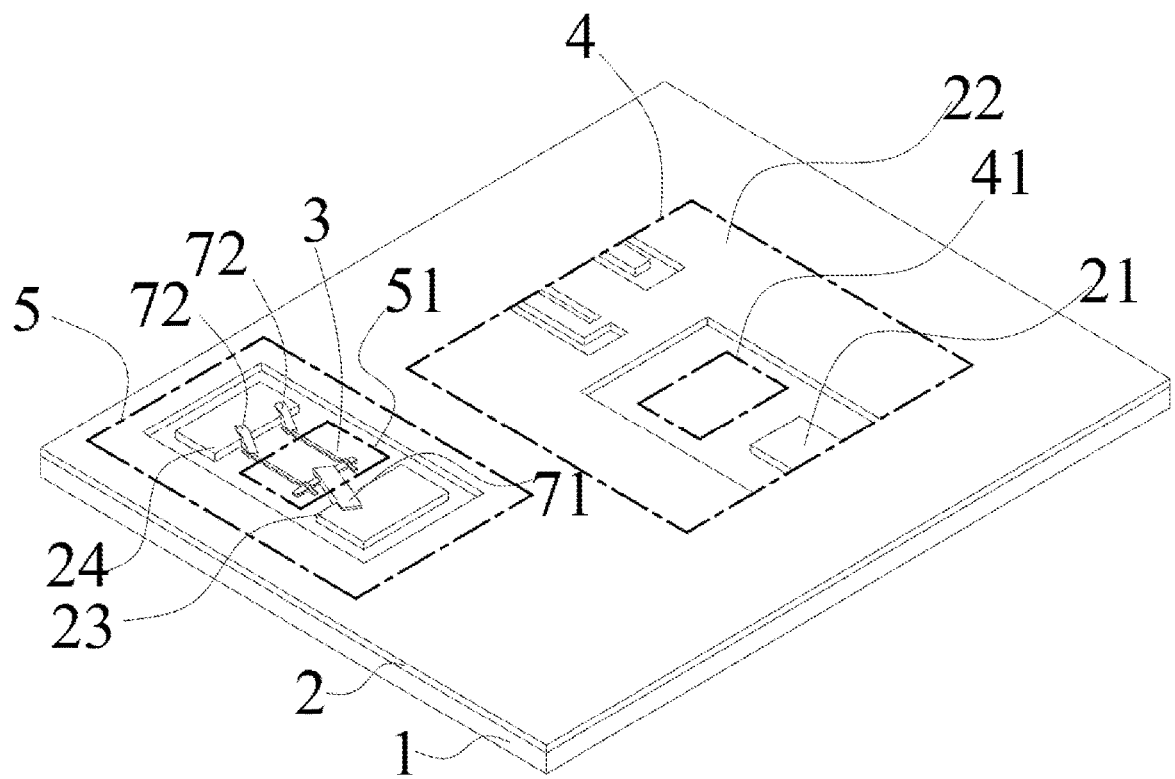
FIG. 5 is a schematic diagram of a connection structure of an electrical connection of a Josephson junction 3 to a first conductive plate 23 and a second conductive plate 24 according to an embodiment of the present application.

FIG. 3B shows an electrical connection structure of the Josephson junction 3, the first conductive plate 23, and the second conductive plate 24; and FIG. 5 is a schematic diagram of another connection structure for an electrical connection between the Josephson junction 3, the first conductive plate 23, and the second conductive plate 24 according to the present application.

Referring to FIG. 3B and FIG. 5, in some other embodiments of the present application, the step of forming the Josephson junction 3 in the second junction region 51, and enabling the first superconducting layer 31 and the second superconducting layer 33 of the Josephson junction 3 to be electrically connected to the first conductive plate 23 and the second conductive plate 24 in a one-to-one correspondence manner in Step S200 may include the following Sub-step 1 and Sub-step 2:

Sub-step 1: sequentially forming the first superconducting layer 31, the oxide film layer 32, and the second superconducting layer 33 in the second junction region 51, and enabling the first superconducting layer 31, the oxide film layer 32, and the second superconducting layer 33 to be partially overlapped to form a three-layer stacked structure of superconductor (S)-semiconductor or insulator (I)-superconductor (S), namely, the Josephson junction 3, where an interlayer between the first superconducting layer 31 and the second superconducting layer 33 is a barrier layer of the Josephson junction 3, and the interlayer may be an oxide film layer 32; and Sub-step 2: forming a first transition structure 71 covering part of the first superconducting layer 31 and part of the first conductive plate 23, and forming a second transition structure 72 covering part of the second superconducting layer 33 and part of the second conductive plate 24.

FIG. 5 is different from the structure shown in FIG. 3B in extending directions of the first transition structure 71 and the second transition structure 72.

With reference to FIG. 5, in an implementation of some other embodiments of the present application, an extending direction of the first transition structure 71 is different from that of the first superconducting layer 31. In another implementation of some other embodiments of the present application, an extending direction of the second transition structure 72 is different from that of the second superconducting layer 33. In a third implementation of some other embodiments of the present application, an extending direction of the first transition structure 71 is different from that of the first superconducting layer 31, and an extending direction of the second transition structure 72 is different from that of the second superconducting layer 33.

With reference to FIG. 5, in some implementations of some other embodiments of the present application, the extending directions of the first transition structure 71 and the second transition structure 72 are parallel to each other, so that the first transition structure 71 and the second transition structure 72 are fabricated and formed by means of a one-time coating process.

Figure 6A:
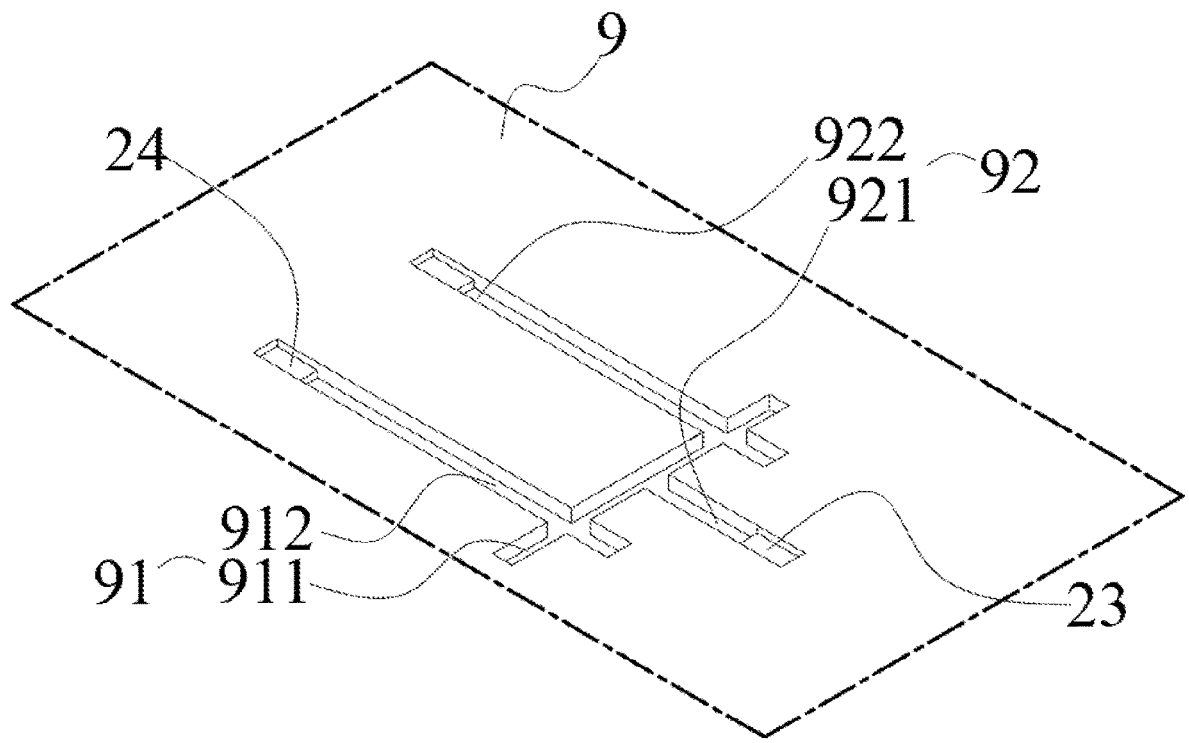
FIG. 6A is a schematic diagram of a partial structure of a mask pattern layer 9 for forming a Josephson junction 3 in a second junction region 51 according to an embodiment of the present application.
Figure 6B:
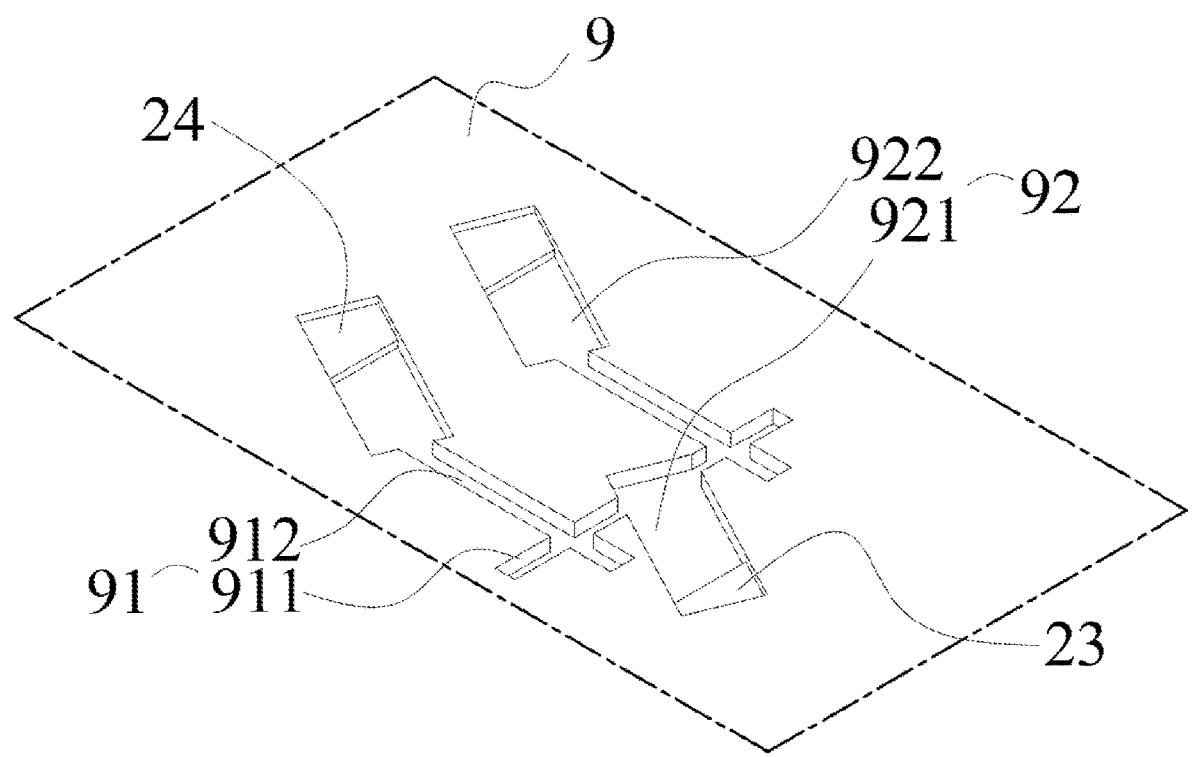
FIG. 6B is a schematic diagram of a partial structure of another mask pattern layer 9 for forming a Josephson junction 3 in a second junction region 51 according to an embodiment of the present application.

FIG. 6A is a schematic diagram of a partial structure of a mask pattern layer 9 for forming a Josephson junction 3 in a second junction region 51 according to the present application; and FIG. 6B is a schematic diagram of a partial structure of another mask pattern layer 9 for forming a Josephson junction 3 in a second junction region 51 according to the present application.

In some other embodiments of the present application, according to Sub-Step 1 and Sub-Step 2 in Step S200, the first superconducting layer 31, the oxide film layer 32, and the second superconducting layer 33, as well as the first transition structure 71 and the second transition structure 72 may be formed by using a pattern transfer process. Referring to FIG. 6A and FIG. 6B, an exemplary specific process is as follows:

first, forming a mask pattern layer 9 including a junction fabrication window 91 and a transition window 92 on the substrate 1, where the mask pattern layer 9 may be formed by using a single layer of a photoresist or a dual layer of a photoresist, the junction fabrication window 91 includes a first deposition window 911 exposing the first deposition region 52 and a second deposition window 912 exposing the second deposition region 53, and the first deposition region 52 intersects with the second deposition region 53; and the transition window 92 includes a first transition window 921 exposing part of the first conductive plate 23 and a second transition window 922 exposing part of the second conductive plate 24, the first transition window 921 intersects with the first deposition window 911, and the second transition window 922 intersects with the second deposition window 912;

second, performing directional deposition by using the first deposition window 911 to form a superconducting material layer in the first deposition region 52;

third, oxidizing the superconducting material layer to form the first superconducting layer 31 and the oxide film layer 32 located on the first superconducting layer 31;

fourth, performing directional deposition by using the second deposition window 912 to form the second superconducting layer 33 in the second deposition region 53, and enabling the second superconducting layer 33 to be partially located on the oxide film layer 32; and finally, forming, by using the first transition window 921, the first transition structure 71 covering part of the first superconducting layer 31 and part of the first conductive plate 23, and forming, by using the second transition window 922, the second transition structure 72 covering part of the second superconducting layer 33 and part of the second conductive plate 24.

With reference to FIG. 6B, compared with FIG. 6A, in order to make the extending direction of the first transition structure 71 different from that of the first superconducting layer 31, an extending direction of the first transition window 921 formed on the mask pattern layer 9 is different from that of the first deposition window 911; and in order to make the extending direction of the second transition structure 72 different from that of the second superconducting layer 33, the extending direction of the second transition window 922 formed on the mask pattern layer 9 is different from that of the second deposition window 912.

In some implementations of some other embodiments of the present application, before Sub-Step 2 in Step S200, a step of removing an oxide layer on a surface of the first conductive plate 23 and an oxide layer on a surface of the second conductive plate 24 is further included.

An implementation of removing the oxide layer on the surface of the first conductive plate 23 and the oxide layer on the surface of the second conductive plate 24 includes: removing the oxide layer on the surface of the first conductive plate 23 and the oxide layer on the surface of the second conductive plate 24 by using an ion beam etching. The oxide layer on the surface of the first conductive plate 23 and the oxide layer on the surface of the second conductive plate 24 are etched and removed by using an ion beam, which helps to implement good electrical contact, and further helps to accurately detect an electrical parameter of the Josephson junction 3.

Compared with FIG. 6A, the mask pattern layer 9 shown in FIG. 6B facilitates etching and removing of the oxide layer on the surface of the first conductive plate 23 and the oxide layer on the surface of the second conductive plate 24.

In order to avoid damage to the Josephson junction 3 during ion beam etching (that is, etching is performed on the stacked structure of superconductor (S)-semiconductor or insulator (I)-superconductor (S)) and impact on performance of the Josephson junction 3, directional etching is performed by using ion beam etching in the embodiments of the present application. With reference to FIG. 6B, an inclination angle is determined based on the junction fabrication window 91 and the transition window 92, so that when directional ion beam etching is performed for an oxide layer on part of the surface of the first conductive plate 23 and the oxide layer on part of the surface of the second conductive plate 24 according to the inclination angle, the Josephson junction 3 is shielded by the mask pattern layer 9. Therefore, the oxide layer on part of the surface of the first conductive plate 23 and the oxide layer on part of the surface of the second conductive plate 24 are subjected to directional ion beam etching according to the inclination angle.

In an embodiment of the present application, when directional etching is performed by using ion beam etching, the inclination angle is adjusted to etch the oxide layer of a region, covered by the first transition structure 71, of the surface of the first superconducting layer 31 and the oxide layer of a region, covered by the second transition structure 72, of the surface of the second superconducting layer 33, so as to avoid a defect of poor electrical contact caused by the oxide layer.

In some embodiments of the present application, the step of separating the Josephson junction 3 from the first conductive plate 23 and the second conductive plate 24 through cutting, and moving the Josephson junction 3 to the first junction region 41 in Step S400 may include the following Sub-step 1 and Sub-step 2.

Sub-step 1: Cutting and removing a graft structure 6 including a second portion substrate 511 and the Josephson junction 3, where the second portion substrate 511 is a portion of the substrate 1 where the Josephson junction 3 is located. Exemplarily, microscopic cutting is performed by using a focused ion beam, so as to implement cutting and removing of the graft structure 6, and after the graft structure 6 is cut and removed from the second junction region 51, a corresponding second junction groove 512 is formed in the second junction region 51 synchronously.

Sub-step 2: Cutting and removing a first portion substrate 411 from the first junction region 41 to form a first junction groove 412 in the first junction region 41, and moving the graft structure 6 into the first junction groove 412.

In some embodiments of the present application, before Step S500 of forming a first connection structure 81 for connecting the first superconducting layer 31 to the first electrical element 21 and a second connection structure 82 for connecting the second superconducting layer 33 to the second electrical element 22, the method may further include a step of removing an oxide layer on a surface of the first electrical element 21 and an oxide layer on a surface of the second electrical element 22. In addition, similar to the implementation of removing the oxide layer on the surface of the first conductive plate 23 and the oxide layer on the surface of the second conductive plate 24, the oxide layer on the surface of the first electrical element 21 and the oxide layer on the surface of the second electrical element 22 may be removed by using an ion beam etching.

An embodiment of the present application further provides a superconducting quantum chip, and the superconducting quantum chip includes a superconducting circuit fabricated by using the fabrication method for a superconducting circuit according to specific implementations of the present application.

It should be understood that, "some embodiments", "an embodiment", and "an implementation" throughout this specification means that specific features, structures or characteristics related to the embodiments may be included in at least one embodiment of the present application. Therefore, descriptions of "in some embodiments", "in an embodiment", and "in an implementation" in various places throughout this specification are not necessarily referring to a same embodiment. In addition, in embodiments of a specific implementation, and in various implementations, the specific features, structures, or characteristics may be combined in one or more embodiments in any appropriate manner.

The constructions, features and functions of the present application are described in detail in the embodiments with reference to the accompanying drawings. The foregoing is merely preferred embodiments of the present application, and the present application is not limited by the accompanying drawings. All equivalent embodiments that are modified or changed according to the concept of the present application and do not depart from the spirit of the description and the drawings should fall within the protection scope of the present application.

What is claimed is:

1. A fabrication method for a superconducting circuit, wherein the superconducting circuit comprises a Josephson junction, and the Josephson junction comprises a first superconducting layer electrically connected to a first electrical element and a second superconducting layer electrically connected to a second electrical element; and the fabrication method comprises:

determining, on a substrate, a first junction region located between the first electrical element and the second electrical element, and a second junction region located between a first conductive plate and a second conductive plate that are formed in advance;

forming the Josephson junction in the second junction region, and enabling the first superconducting layer and the second superconducting layer of the Josephson junction to be electrically connected to the first conductive plate and the second conductive plate in a one-to-one correspondence manner;

connecting the first conductive plate and the second conductive plate to a detection circuit to detect an electrical parameter of the Josephson junction, and determining whether the electrical parameter is within a target parameter range; and if the electrical parameter is within the target parameter range, separating the Josephson junction from the first conductive plate and the second conductive plate through cutting, moving the Josephson junction to the first junction region, and forming a first connection structure connecting the first superconducting layer to the first electrical element and a second connection structure connecting the second superconducting layer to the second electrical element.

2. The fabrication method according to claim 1, wherein the first electrical element, the second electrical element, the first conductive plate, and the second conductive plate are formed in advance by using a patterning process.

3. The fabrication method according to claim 1, wherein the second junction region comprises a first deposition region and a second deposition region, and a partial overlap exists between the first deposition region and the second deposition region.

4. The fabrication method according to claim 1, wherein a barrier layer is formed between the first superconducting layer and the second superconducting layer.

5. The fabrication method according to claim 4, wherein the barrier layer is an oxide film layer.

6. The fabrication method according to claim 1, wherein the first electrical element is a capacitor, and the second electrical element is a ground layer.

7. The fabrication method according to claim 1, wherein the step of separating the Josephson junction from the first conductive plate and the second conductive plate through cutting, and moving the Josephson junction to the first junction region comprises:

cutting and removing a graft structure comprising a second portion substrate and the Josephson junction, wherein the second portion substrate is a portion of the substrate where the Josephson junction is located; and forming a first junction groove in the first junction region, and moving the graft structure into the first junction groove.

8. The fabrication method according to claim 7, wherein microscopic cutting is performed by using a focused ion beam to implement cutting and removing of the graft structure, and after the graft structure is cut and removed from the second junction region, a corresponding second junction groove is synchronously formed in the second junction region.

9. The fabrication method according to claim 1, wherein the step of forming the Josephson junction in the second junction region, and enabling the first superconducting layer and the second superconducting layer of the Josephson junction to be electrically connected to the first conductive plate and the second conductive plate in a one-to-one correspondence manner comprises:

forming a superconducting material layer partially located in the second junction region and enabling one end of the superconducting material layer to extend to be electrically connected to the first conductive plate;

oxidizing the superconducting material layer to form the first superconducting layer and the oxide film layer on the first superconducting layer; and forming the second superconducting layer having one end extending to be electrically connected to the second conductive plate, and enabling the second superconducting layer to be partially located on the oxide film layer, wherein the Josephson junction is formed at a stacked position of the first superconducting layer, the oxide film layer, and the second superconducting layer.

10. The fabrication method according to claim 1, wherein the step of forming the Josephson junction in the second junction region, and enabling the first superconducting layer and the second superconducting layer of the Josephson junction to be electrically connected to the first conductive plate and the second conductive plate in a one-to-one correspondence manner comprises:

sequentially forming the first superconducting layer, the oxide film layer, and the second superconducting layer, wherein the first superconducting layer, the oxide film layer, and the second superconducting layer are partially overlapped at the second junction region to form the Josephson junction; and forming a first transition structure covering part of the first superconducting layer and part of the first conductive plate, and forming a second transition structure covering part of the second superconducting layer and part of the second conductive plate.

11. The fabrication method according to claim 10, wherein an extending direction of the first transition structure is different from an extending direction of the first superconducting layer.

12. The fabrication method according to claim 10, wherein an extending direction of the second transition structure is different from an extending direction of the second superconducting layer.

13. The fabrication method according to claim 10, wherein the extending directions of the first transition structure and the second transition structure are parallel to each other.

14. The fabrication method according to claim 10, wherein before the step of forming a first transition structure covering part of the first superconducting layer and part of the first conductive plate, and covering a second transition structure of part of the second superconducting layer and part of the second conductive plate, the fabrication method further comprises:

a step of removing an oxide layer on a surface of the first conductive plate and an oxide layer on a surface of the second conductive plate.

15. The fabrication method according to claim 14, wherein the step of removing an oxide layer on a surface of the first conductive plate and an oxide layer on a surface of the second conductive plate comprises:

removing the oxide layer on the surface of the first conductive plate and the oxide layer on the surface of the second conductive plate by using an ion beam etching.

16. The fabrication method according to claim 1, wherein before the step of forming a first connection structure connecting the Josephson junction to the first electrical element, and a second connection structure connecting the Josephson junction to the second electrical element, the fabrication method further comprises:
   a step of removing an oxide layer on a surface of the first electrical element and an oxide layer on a surface of the second electrical element.

\* \* \* \* \*